(12) United States Patent
He et al.

(10) Patent No.: US 9,543,407 B2
(45) Date of Patent: Jan. 10, 2017

(54) LOW-K SPACER FOR RMG FINFET FORMATION

(71) Applicant: INTERNATIONAL BUSINESS MACHINES CORPORATION, Armonk, NY (US)

(72) Inventors: Hong He, Schenectady, NY (US); Chiahsun Tseng, Wynantskill, NY (US); Tenko Yamashita, Schenectady, NY (US); Chun-Chen Yeh, Clifton Park, NY (US); Yunpeng Yin, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 4 days.

(21) Appl. No.: 14/191,751

(22) Filed: Feb. 27, 2014

(65) Prior Publication Data

US 2015/0243760 A1 Aug. 27, 2015

(51) Int. Cl.
*H01L 29/66* (2006.01)
*H01L 29/08* (2006.01)
*H01L 29/78* (2006.01)

(52) U.S. Cl.
CPC ..... *H01L 29/66545* (2013.01); *H01L 29/0847* (2013.01); *H01L 29/6653* (2013.01); *H01L 29/66795* (2013.01); *H01L 29/785* (2013.01)

(58) Field of Classification Search
CPC ............. H01L 29/66795; H01L 29/785; H01L 29/66545; H01L 21/845; H01L 29/6653
USPC ......... 438/299, 585, 322, 347; 257/368, 288
See application file for complete search history.

(56) References Cited

U.S. PATENT DOCUMENTS

| | | | |
|---|---|---|---|
| 7,365,678 B2 | 4/2008 | Heine et al. | |
| 7,812,411 B2 | 10/2010 | Cheng | |
| 7,829,943 B2 | 11/2010 | Sell | |
| 8,450,178 B2 | 5/2013 | Cheng et al. | |
| 2007/0152266 A1 | 7/2007 | Doyle et al. | |
| 2008/0315309 A1* | 12/2008 | Chang et al. | 257/346 |
| 2011/0298053 A1* | 12/2011 | Zhong | H01L 21/28176 257/368 |
| 2013/0092984 A1 | 4/2013 | Liu et al. | |
| 2013/0095629 A1* | 4/2013 | Ando et al. | 438/299 |
| 2013/0187229 A1 | 7/2013 | Cheng et al. | |
| 2013/0277686 A1* | 10/2013 | Liu | H01L 29/6653 257/77 |

(Continued)

OTHER PUBLICATIONS

Agrawal, S., et al. "A Physical Model for Fringe Capacitance in Double-Gate MOSFETs With Non-Abrupt Source/Drain Junctions and Gate Underlap" IEEE Transactions on Electron Devices, vol. 57, No. 5. May 2010. pp. 1069-1075.

(Continued)

*Primary Examiner* — Bradley K Smith
*Assistant Examiner* — David Goodwin
(74) *Attorney, Agent, or Firm* — Tutunjian & Bitetto, P.C.; Vazken Alexanian

(57) ABSTRACT

A method for semiconductor fabrication includes providing mask layers on opposite sides of a substrate, the substrate having one or more mandrels. Dummy spacers are formed along a periphery of the mask layers. A dummy gate structure is formed between the dummy spacers. The dummy spacers are removed to provide a recess. Low-k spacers are formed in the recess.

13 Claims, 5 Drawing Sheets

(56) References Cited

U.S. PATENT DOCUMENTS

2014/0054713 A1* 2/2014 Lee et al. ............... 257/368
2014/0110798 A1* 4/2014 Cai .................. H01L 29/78
                                                257/410
2015/0294879 A1* 10/2015 Zhu .............. H01L 21/82343
                                                438/283

OTHER PUBLICATIONS

Huang, E., et al. "Low-K Spacers for Advanced Low Power CMOS Devices With Reduced Parasitic Capacitances" 2008 IEEE International SOI Conference Proceedings. Oct. 2008. pp. 19-20.

* cited by examiner

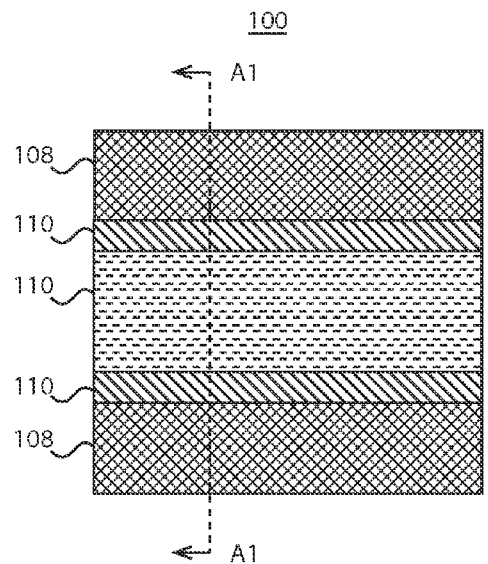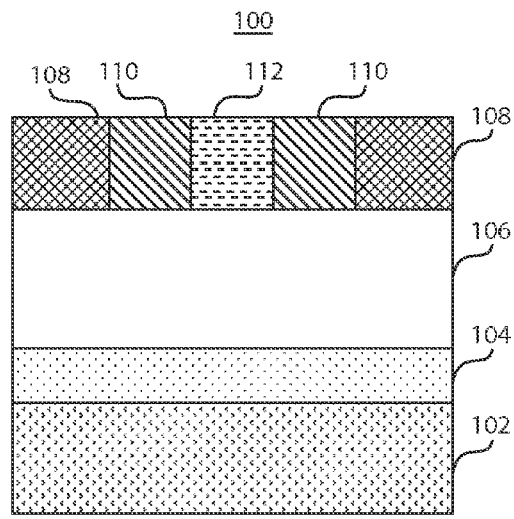
FIG. 3A　　　　FIG. 3B
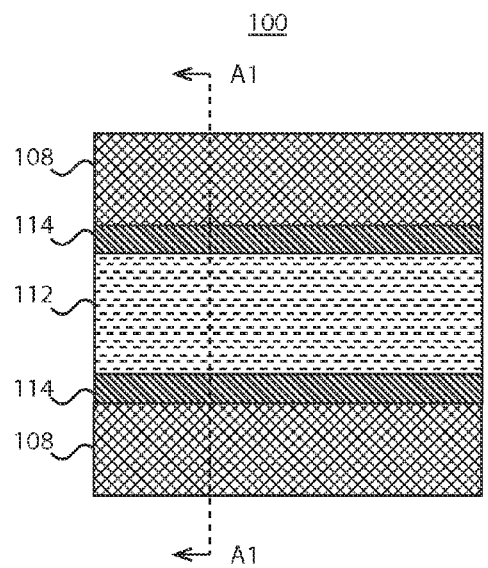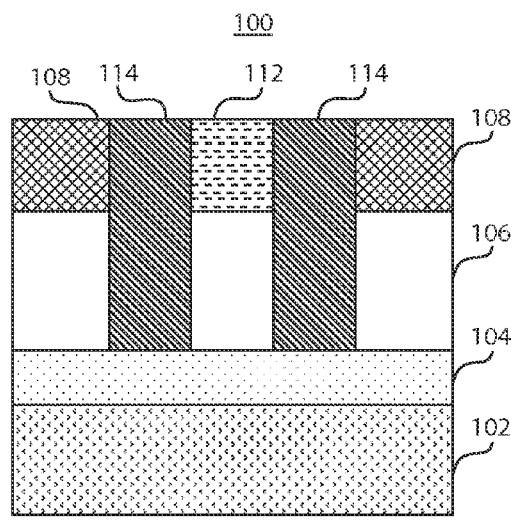
FIG. 4A　　　　FIG. 4B

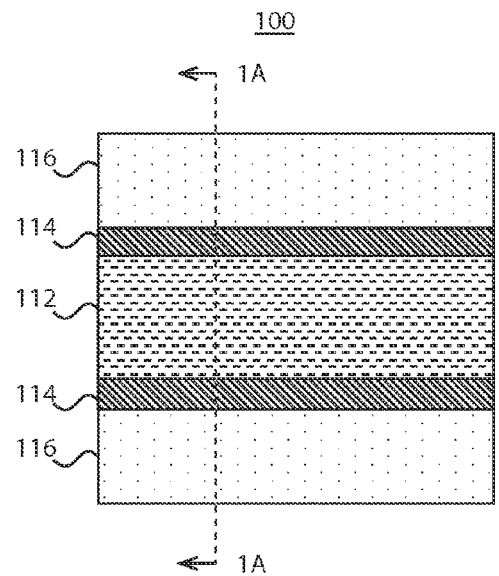
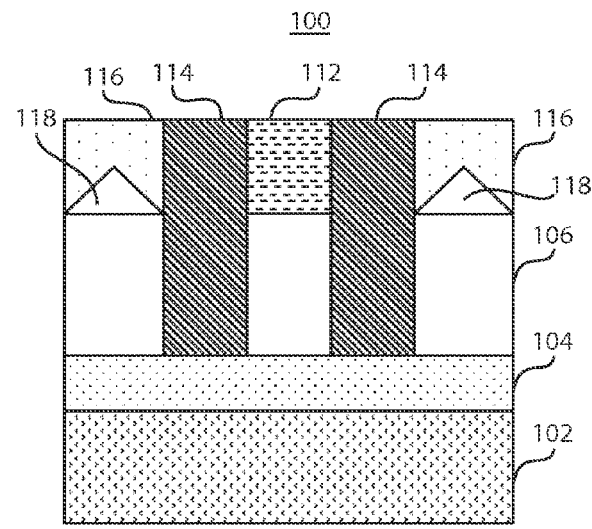
FIG. 5A  FIG. 5B
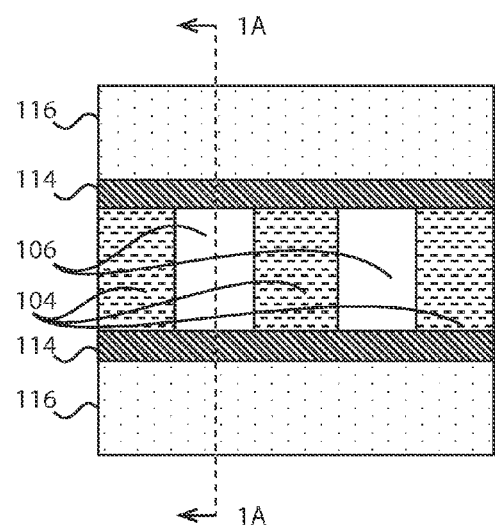
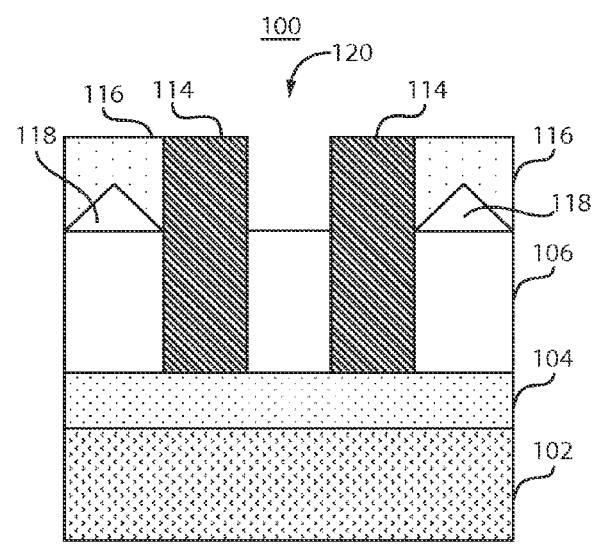
FIG. 6A  FIG. 6B

LOW-K SPACER FOR RMG FINFET FORMATION

BACKGROUND

Technical Field

The present invention relates to semiconductor fabrication, and more particularly to the fabrication of a low-K spacer for replacement metal gate fin field effect transistor.

Description of the Related Art

The replacement metal gate (RMG) fin field effect transistor (finFET) fabrication process typically includes first patterning the gate, followed by conformal spacer deposition, spacer etch, and then source/drain epitaxial merge. However, the spacer etch step can introduce both fin erosion in the source/drain area and also top corner rounding of the dummy gate hard mask. Source/drain fin erosion raises fin epitaxial merge concerns. Gate hard mask top corner rounding can potentially cause epitaxial nodules at source/drain epitaxial merge.

SUMMARY

A method for semiconductor fabrication includes providing mask layers on opposite sides of a substrate, the substrate having one or more mandrels. Dummy spacers are formed along a periphery of the mask layers. A dummy gate structure is formed between the dummy spacers. The dummy spacers are removed to provide a recess. Low-k spacers are formed in the recess.

A method for semiconductor fabrication includes providing mask layers on opposite sides of a substrate, the substrate having one or more mandrels. Dummy spacers are formed along a periphery of the mask layers. A dummy gate structure is formed between the dummy spacers. The dummy spacers are removed to provide a recess. Low-k spacers are formed in the recess. The mask layers are removed to form raised source/drain regions such that source/drain regions of neighboring mandrels are epitaxially merged. The dummy gate structure is removed and a replacement metal gate structure is formed.

A semiconductor device includes a substrate having one or more mandrels formed thereon. A replacement gate structure is formed over the one or more mandrels. Low-k spacers are formed about a periphery of the replacement gate structure, the low-k spacers extending through the one or more mandrels to an underlying oxide layer. Raised source/drain regions are also formed.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 3A shows a top-down view of the semiconductor device having a dummy gate structure formed between the dummy spacers, in accordance with one illustrative embodiment;

FIG. 3B shows a cross-sectional view of the semiconductor device in FIG. 3A along section line 1A-1A, in accordance with one illustrative embodiment;

FIG. 4A shows a top-down view of the semiconductor device having dummy spacers removed and low-k spacers formed, in accordance with one illustrative embodiment;

FIG. 4B shows a cross-sectional view of the semiconductor device in FIG. 4A along section line 1A-1A, in accordance with one illustrative embodiment;

FIG. 5A shows a top-down view of the semiconductor device having raised source/drain regions formed for epitaxial merging, in accordance with one illustrative embodiment;

FIG. 5B shows a cross-sectional view of the semiconductor device in FIG. 5A along section line 1A-1A, in accordance with one illustrative embodiment;

FIG. 6A shows a top-down view of the semiconductor device having the dummy gate structure removed, in accordance with one illustrative embodiment;

FIG. 6B shows a cross-sectional view of the semiconductor device in FIG. 6A along section line 1A-1A, in accordance with one illustrative embodiment;

DETAILED DESCRIPTION OF PREFERRED EMBODIMENTS

Figure 1A:
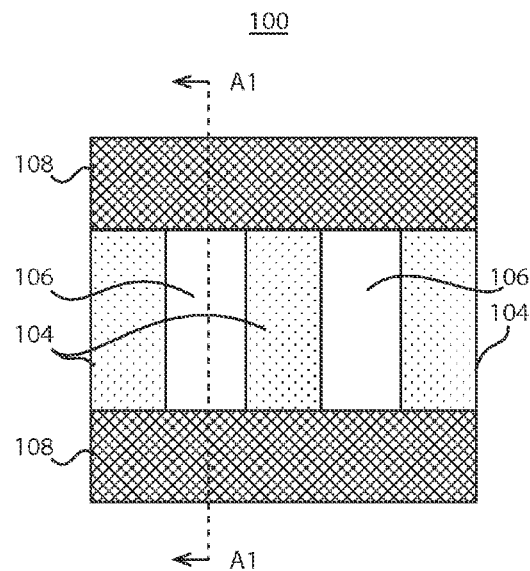
FIG. 1A shows a top-down view of a semiconductor device having mandrels formed on a substrate and mask layers formed at opposite end portions of the substrate, in accordance with one illustrative embodiment.

In accordance with the present principles, semiconductor devices and methods of fabrication are provided for the formation of a low-k spacer for a replacement metal gate (RMG) fin field effect transistor (finFET). A semiconductor substrate is first provided having a buried oxide layer (BOX) and silicon on insulator (SOI) formed thereon. The SOI layer may be patterned to form one or more mandrels or fins. Mask layers are formed on opposite end portions of the substrate.

Dummy spacers are formed along a periphery of the masks layers. A dummy gate structure is then formed between the dummy spacers. The dummy spacers are removed by etching to provide an opening. The etch preferably is applied through the mandrels to an underlying oxide layer. Low-k spacers are formed in the opening. The mask is removed and raised source/drain regions are formed such that source/drain regions of neighboring mandrels are epitaxially merged. The dummy gate is removed and a replacement metal gate is formed.

A low-k spacer for RMG finFET formation is provided using a replacement dummy spacer, where the dummy spacer is formed first and replaced by the real spacer. This enables a spacer with a lower dielectric constant in a finFET structure with excellent gate encapsulation for better manufacturability. One advantage of the present principles is that the spacer formation won't need to be conformal. Additionally, fin erosion and gate top hard mask corner rounding can be mitigated. The present principles provide for more potential material options for spacer formation.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1B:
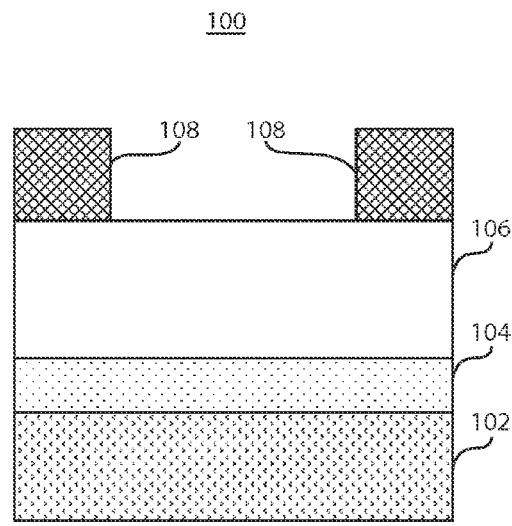
FIG. 1B shows a cross-sectional view of the semiconductor device in FIG. 1A along section line 1A-1A, in accordance with one illustrative embodiment.

Referring now to the drawings in which like numerals represent the same or similar elements and initially to FIG. 1A and FIG. 1B, a semiconductor device 100 is illustratively depicted in accordance with one embodiment. FIG. 1A shows a top-down view of the semiconductor device 100. FIG. 1B shows a cross-sectional view of the semiconductor device 100 along section line 1A-1A.

The semiconductor structure 100 is formed in a semiconductor substrate 102, which may include bulk silicon, monocrystalline silicon, germanium, gallium arsenide, or any other suitable material or combination of materials. Substrate 102 preferably includes a buried oxide (BOX) layer 104 and semiconductor-on-insulator (SOI) layer (not shown) formed in or on the substrate 102. BOX layer 104 may include silicon dioxide, silicon nitride, or any other suitable dielectric material. SOI layer may include any suitable semiconductor such as, e.g., silicon, germanium, silicon germanium, a group III-V semiconductor such as, e.g., gallium arsenide, a group II-VI semiconductor, etc.

Mandrels 106 are formed from the SOI layer. While the device 100 in FIG. 1A is shown having two mandrels 106, it should be understood that the device 100 may include more or less than two mandrels 106. Formation of the mandrels 106 may include a lithographic process to form a mask layer (not shown) and etch exposed portions of the SOI layer to form mandrels 106. Mandrels 106 preferably have a width of or about, e.g., 20-25 nanometers. The mandrels 106 are shown having the mask layer from the lithographic mandrel patterning step removed. However, in one embodiment, the mask layer from the lithographic mandrel patterning step may remain over the mandrels 106.

In some embodiments, the mandrels 106 may include fin structures. Fin structures refer to a semiconductor material, which is employed as the body of a semiconductor device, in which the gate structure is positioned around the fin structure such that charge flows down the channel on the two sidewalls of the fin structure and optionally along the top surface of the fin structure. The semiconductor structure 100 may further comprise other features or structures that are formed in previous process steps.

Gate trench masks 108 are formed on opposite end portions of the semiconductor structure 100. The gate trench masks 108 preferably have a width of or about, e.g., 10 nanometers. The gate trench masks 108 preferably include hardmasks and may be formed by deposition, photolithography and etching. The gate trench masks 108 may include oxides, nitrides, oxynitrides or any other suitable material. Preferably, the gate trench masks 108 include silicon nitride.

Figure 2A:
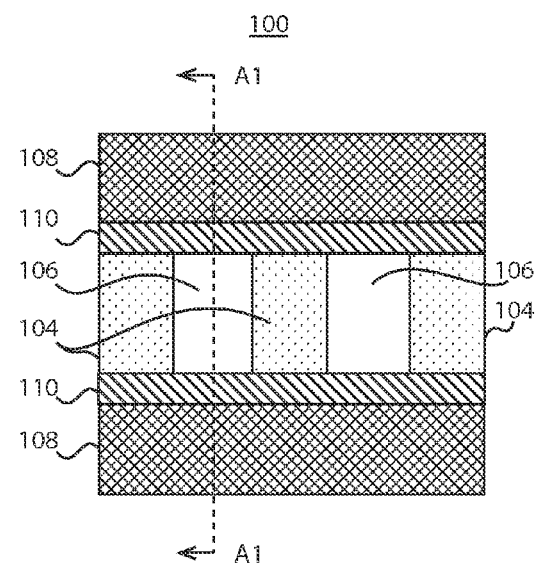
FIG. 2A shows a top-down view of the semiconductor device having dummy spacers formed along a periphery of the mask layers, in accordance with one illustrative embodiment.
Figure 2B:
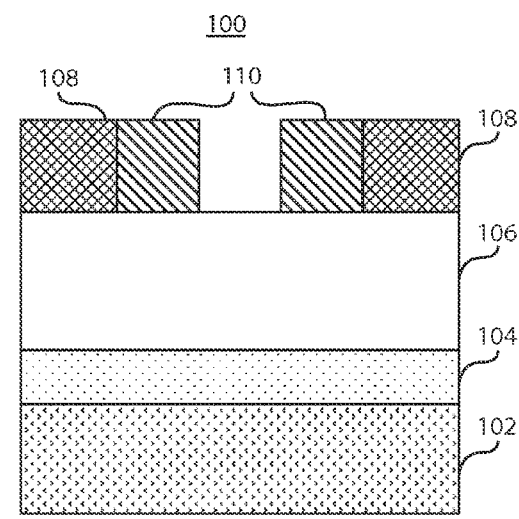
FIG. 2B shows a cross-sectional view of the semiconductor device in FIG. 2A along section line 1A-1A, in accordance with one illustrative embodiment.

Referring now to FIG. 2A and FIG. 2B, dummy spacers 110 are formed using known processes. FIG. 2A shows a top-down view of the semiconductor device 100. FIG. 2B shows a cross-sectional view of the semiconductor device 100 along sectional line 1A-1A.

The dummy spacers 110 are formed along a periphery of the trench masks 108 and over and above portions of the BOX layer 104 and mandrels 108. Preferably, the dummy spacers 110 have a width of or about, e.g., 4 nanometers. The dummy spacers 110 may include any material that may be selectively removed. In one embodiment, the dummy spacers 110 may include silicon oxide, silicon nitride, silicon oxynitride, silicon carbide, fluoride-doped silicate glass (FSG), combinations thereof, and/or any other suitable material. In one particularly useful embodiment, the dummy spacers 110 are formed by depositing a nitride material and performing a reactive ion etch (RIE) to form the spacers.

Referring now to FIG. 3A and FIG. 3B, a sacrificial gate structure 112 is formed. FIG. 3A shows a top-down view of the semiconductor device 100. FIG. 3B shows a cross-sectional view of the semiconductor device 100 along sectional line 1A-1A.

The sacrificial gate structure 112 may also be referred to as a dummy gate. The dummy gate 112 is formed between dummy spacers 110 and over and above exposed portions of the BOX layer 104 and mandrels 108. The dummy gate 112 may comprise any suitable material that can be selectively etched to the underlying mandrel 106. For example, the dummy gate 112 may be composed of a semiconductor material, such as, e.g., polycrystalline silicon, amorphous silicon, microcrystal silicon, or any other suitable material or combinations of materials. Although, the dummy gate 112 is typically composed of a semiconductor material, the dummy gate 112 may also be composed of a dielectric material, such as an oxide, nitride or oxynitride material, or amorphous carbon. In one particularly useful embodiment, forming the dummy gate 112 may include depositing the, e.g., polycrystalline silicon material and performing chemical-mechanical planarization (CMP).

Referring now to FIG. 4A and FIG. 4B, the dummy spacers 110 are removed and low-k spacers 114 are formed. FIG. 4A shows a top-down view of the semiconductor device 100. FIG. 4B shows a cross-sectional view of the semiconductor device 100 along sectional line 1A-1A.

Removal of the dummy spacers 110 preferably includes etching the dummy spacers 110. The etch is applied through the underlying fin layer 106 to the surface of the BOX layer 104. The etch of the dummy spacers 110 has minimal erosion to the gate 120 (formed later) and mandrels 106. A low-k spacer material is deposited in the resulting opening to form low-k spacers 114. The low-k spacer deposition may include non-conformal chemical vapor deposition (CVD) techniques.

A low-k spacer is a spacer having a dielectric constant less than the dielectric constant of silicon nitride at room temperature. For example, the low-k spacer may have a dielectric constant of or about 7.0 or less, and preferably at or about, e.g., 5.0. Examples of low-k materials include, but are not limited to, hydrogen silsesquioxane polymer (HSQ), methyl silsesquioxane polymer (MSQ), polyphenylene oligomer, methyl doped silica or SiOx(CH3)y or SiCxOyHy or SiOCH, organosilicate glass (SiCOH) and porous SiCOH, silicon oxide, boron nitride, silicon oxynitride and the like.

The low-k material may be deposited by using any suitable techniques such as, e.g., chemical vapor deposition and spin-on coating.

Referring now to FIG. 5A and FIG. 5B, the masks 108 are removed. FIG. 5A shows a top-down view of the semiconductor device 100. FIG. 5B shows a cross-sectional view of the semiconductor device 100 along sectional line 1A-1A.

The masks 108 are preferably etched to expose source/drain regions of the mandrels 106. Raised source/drain regions 118 are formed by epitaxial growth. Epitaxial growth may include depositing silicon seeds on a silicon wafer, e.g., mandrels 106. The process is selective such that the silicon only grows on exposed portions of the silicon of the mandrels 106 and does not grow on oxide or nitride surfaces. The epitaxial growth may continue until the raised source/drain regions 118 reach a desired height measured from an upper surface of the mandrels 106. The epitaxial growth is performed to provide an epitaxial merge of sources and drains of neighboring mandrels 106. An oxide 116 is then deposited over the raised source/drain regions 118.

Referring now to FIG. 6A and FIG. 6B, the dummy gate 112 is removed. FIG. 6A shows a top-down view of the semiconductor device 100. FIG. 6B shows a cross-sectional view of the semiconductor device 100 along sectional line 1A-1A. The dummy gate 112 is etched to provide an opening 120. The etch may include, e.g., a wet etch comprising diluted hydrofluoric acid (DHF) and hot ammonia, or TetraMethyl Ammonium Hydroxide (TMAH). The opening 120 exposes fins 106 and BOX layer 104, shown in FIG. 6A.

Figure 7A:
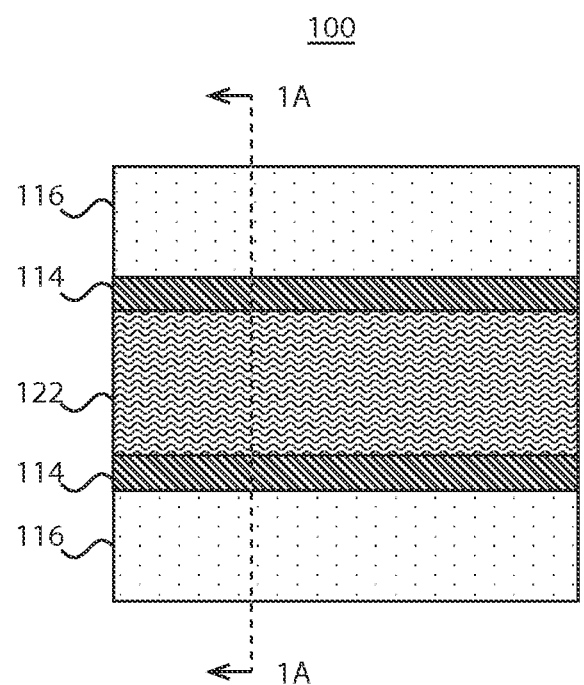
FIG. 7A shows a top-down view of the semiconductor device having a replacement metal gate structure, in accordance with one illustrative embodiment.
Figure 7B:
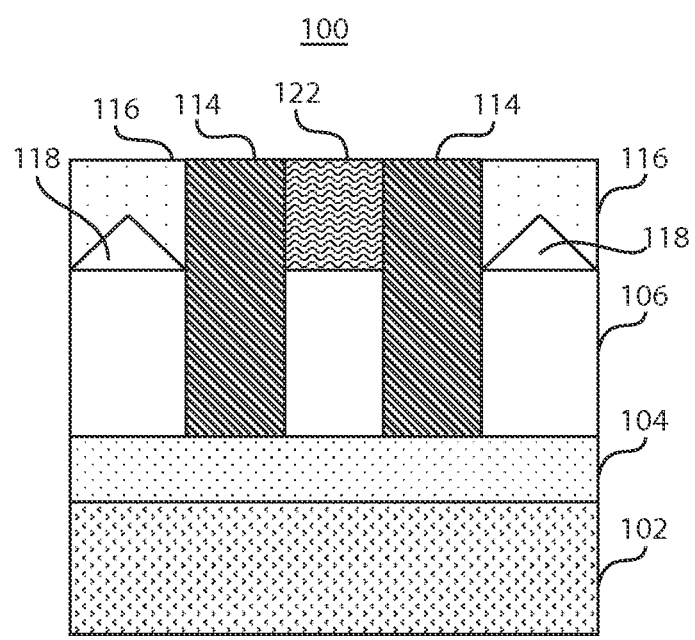
FIG. 7B shows a cross-sectional view of the semiconductor device in FIG. 7A along section line 1A-1A, in accordance with one illustrative embodiment.
Figure 8:
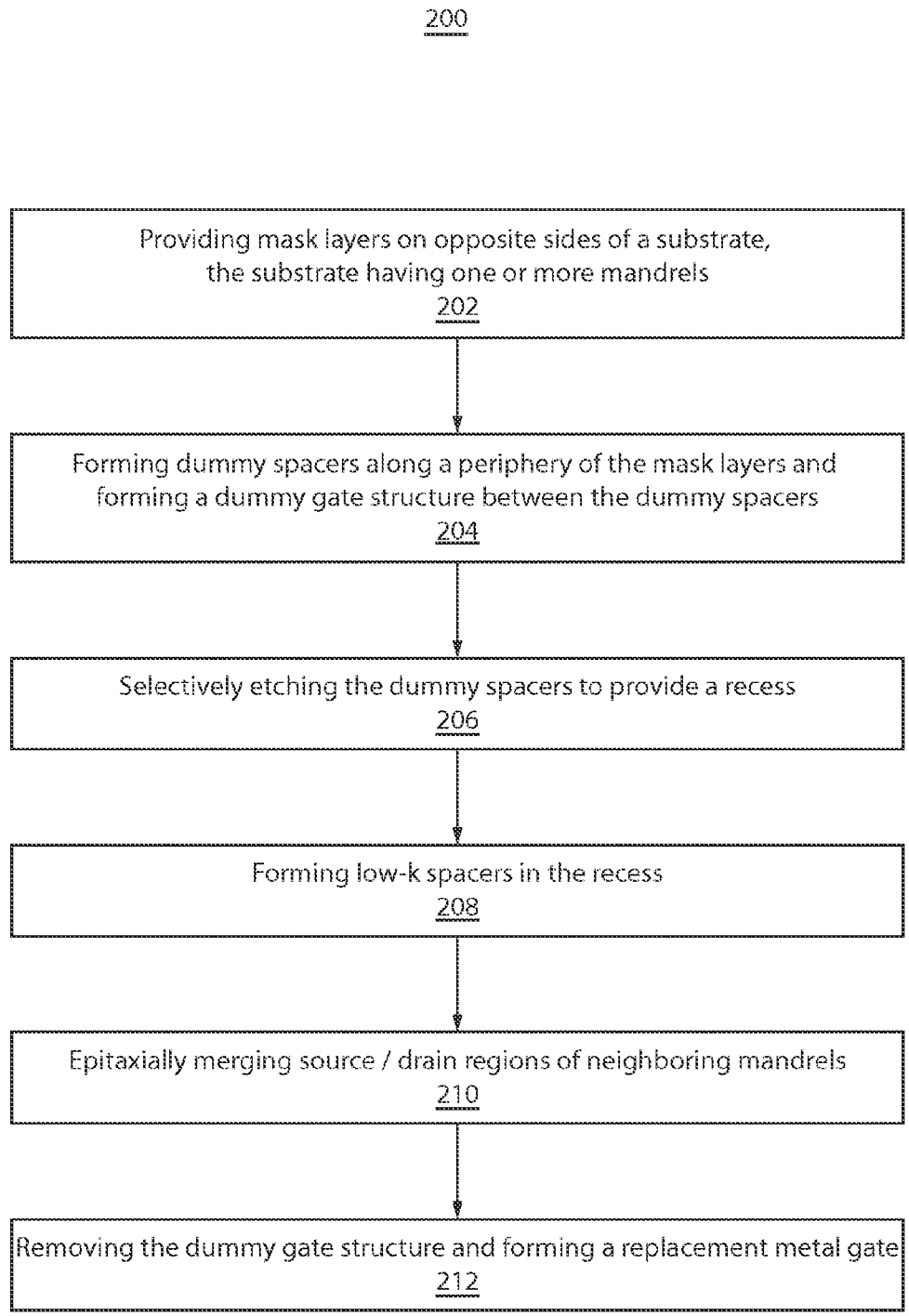
FIG. 8 is a block/flow diagram showing a method for fabricating a semiconductor device having low-k spacers, in accordance with one illustrative embodiment.

Referring now to FIG. 7A and FIG. 7B, a replacement gate structure 122 is formed in the opening 120 using conventional processing steps. FIG. 7A shows a top-down view of the semiconductor device 100. FIG. 7B shows a cross-sectional view of the semiconductor device 100 along sectional line 1A-1A. The gate structure 120 preferably includes a replacement metal gate (RMG) structure. The RMG 120 structure includes at least one gate dielectric and at least one gate conductor. The gate structure 120 may be formed before or after the epitaxial merge shown in FIGS. 7A and 7B.

The device 100 provides fin field effect transistors (fin-FET) having low-k spacers without going through the spacer etch step. One advantage is that spacer formation does not need to be conformal and fin erosion and gate top hard mask corner rounding can be mitigated. There are also more potential material options for spacer formation.

Referring now to FIG. 7, a block/flow diagram showing a method of semiconductor fabrication 200 is illustratively depicted in accordance with one embodiment. In block 202, mask layers are provided on opposite sides of a substrate. The substrate preferably includes an SOI layer formed over a BOX layer. The SOI layer is patterned to form one or more mandrels (e.g., fins). The mask layers are formed across opposite end portions of the one or more mandrels.

In block 204, dummy spacers are formed along a periphery of the mask layers and a dummy gate structure is formed between the dummy spacers. In block 206, the dummy spacers are removed to provide a recess. Preferably, the recess extends through the underlying mandrels to a surface of the BOX layer. In block 208, low-k spacers are formed in the recess. A low-k spacer is a spacer having a dielectric constant less than the dielectric constant of silicon nitride at room temperature, e.g., 7.0 or less, and preferably about, e.g., 5.0.

In block 210, the mask layers are removed to expose source/drain regions of the mandrels. Raised source/drain regions may be formed by epitaxial growth. The epitaxial growth may provide an epitaxial merge of sources and drains of neighboring mandrels. The raised source/drain regions may then be covered by an oxide.

In block 212, the dummy gate structure is removed to expose mandrels and the BOX layer. A replacement gate structure may be formed using known processing steps. Preferably, the replacement gate structure includes a replacement metal gate structure.

Having described preferred embodiments of a method and device for low-K spacer for RMG finFET formation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for semiconductor fabrication, comprising:
providing mask layers on opposite sides of a substrate, the substrate having one or more mandrels, the mask layers extending over an upper surface of the one or more mandrels;
forming dummy spacers along a periphery of the mask layers, the dummy spacers including a portion that is present on said upper surface of the mandrel;
forming a dummy gate structure on said upper surface of the mandrel between the dummy spacers;
removing the dummy spacers to provide a recess;
forming low-k spacers in the recess;
removing the mask layers after forming the low-k spacers; and
forming source and drain regions after removing the mask layers.

2. The method as recited in claim 1, wherein the low-k spacers have a dielectric constant less than a dielectric constant of silicon nitride at room temperature.

3. The method as recited in claim 1, wherein removing the dummy spacers includes etching the dummy spacers through an underlying layer of the one or more mandrels to a surface of an oxide layer.

4. The method as recited in claim 1, wherein providing mask layers includes providing mask layers across opposite end portions of the one or more mandrels.

5. The method as recited in claim 1, wherein forming the source and drain regions includes forming raised source/drain regions including epitaxially merging source/drain regions of neighboring mandrels.

6. The method as recited in claim 1, further comprising removing the dummy gate structure and forming a replacement gate structure.

7. The method as recited in claim 6, wherein the replacement gate structure includes a replacement metal gate structure.

8. The method as recited in claim 1, wherein forming low-k spacers includes non-conformally forming low-k spacers.

9. The method as recited in claim 1, wherein the one or more mandrels includes one or more fins.

10. A method for semiconductor fabrication, comprising:
providing mask layers on opposite sides of a substrate, the substrate having one or more mandrels, the mask layers extending over an upper surface of the one or more mandrels;
forming dummy spacers along a periphery of the mask layers, the dummy spacers including a portion that is present on said upper surface of the mandrel;
forming a dummy gate structure on said upper surface of the mandrel between the dummy spacers;
removing the dummy spacers to provide a recess;
forming low-k spacers in the recess;
removing the mask layers after forming the low-k spacers to form raised source/drain regions such that source/drain regions of neighboring mandrels are epitaxially merged; and
removing the dummy gate structure and forming a replacement metal gate structure.

11. The method as recited in claim 10, wherein the low-k spacers have a dielectric constant less than a dielectric constant of silicon nitride at room temperature.

12. The method as recited in claim 10, wherein removing the dummy spacers includes etching the dummy spacers through an underlying layer of the one or more mandrels to a surface of an oxide layer.

13. The method as recited in claim 10, wherein providing mask layers includes providing mask layers across opposite end portions of the one or more mandrels.

* * * * *